US009319908B2

(12) United States Patent
Nickel et al.

(10) Patent No.: US 9,319,908 B2
(45) Date of Patent: Apr. 19, 2016

(54) METHODS FOR REDUCING PATH LOSS WHILE TESTING WIRELESS ELECTRONIC DEVICES WITH MULTIPLE ANTENNAS

(75) Inventors: Joshua G. Nickel, San Jose, CA (US); Mattia Pascolini, San Mateo, CA (US); Jr-Yi Shen, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 842 days.

(21) Appl. No.: 13/272,067

(22) Filed: Oct. 12, 2011

(65) Prior Publication Data

US 2013/0093447 A1    Apr. 18, 2013

(51) Int. Cl.
*H04W 24/06* (2009.01)
*G01R 29/10* (2006.01)

(52) U.S. Cl.
CPC .............. *H04W 24/06* (2013.01); *G01R 29/10* (2013.01)

(58) Field of Classification Search
CPC ... G10R 29/10; G01R 29/0878; H01R 29/105
USPC ......................................................... 343/703
See application file for complete search history.

(56) References Cited

U.S. PATENT DOCUMENTS

| | | | |
|---|---|---|---|
| 6,313,799 B1 * | 11/2001 | Thimm et al. | 343/703 |
| 7,336,230 B2 * | 2/2008 | Lee et al. | 343/703 |
| 7,444,264 B2 * | 10/2008 | Kildal | 702/182 |
| 7,925,253 B2 | 4/2011 | Breit et al. | |
| 8,228,247 B2 * | 7/2012 | Kitada et al. | 343/703 |
| 2002/0160717 A1 | 10/2002 | Persson et al. | |
| 2008/0081631 A1 | 4/2008 | Rofougaran | |
| 2008/0088509 A1 | 4/2008 | Qin | |
| 2008/0129615 A1 * | 6/2008 | Breit et al. | 343/703 |
| 2010/0240317 A1 * | 9/2010 | Giles et al. | 455/67.13 |
| 2011/0084887 A1 | 4/2011 | Mow et al. | |
| 2011/0102276 A1 * | 5/2011 | Jimenez et al. | 343/703 |

FOREIGN PATENT DOCUMENTS

| | | |
|---|---|---|
| CN | 101162801 | 4/2008 |
| CN | 101512941 | 8/2009 |
| EP | 2264642 | 12/2010 |
| WO | 9318558 | 9/1993 |
| WO | 2008031112 | 3/2008 |

OTHER PUBLICATIONS

Kole et al. U.S. Appl. No. 13/221,642, filed Aug. 30, 2011.
Nickel et al. U.S. Appl. No. 12/942,931, filed Nov. 9, 2010.
Mahe et al. U.S. Appl. No. 12/941,008, filed Nov. 5, 2010.
Chang et al. U.S. Appl. No. 12/872,711, filed Aug. 31, 2010.

* cited by examiner

*Primary Examiner* — Hoang V Nguyen
*Assistant Examiner* — Daniel J Munoz
(74) *Attorney, Agent, or Firm* — Treyz Law Group, P.C.; Jason Tsai; Joseph F. Guihan

(57) ABSTRACT

A test station may include a test host, a test unit, and a test enclosure. A device under test (DUT) having at least first and second antennas may be placed in the test enclosure during production testing. Radio-frequency test signals may be conveyed from the test unit to the DUT using a test antenna in the test enclosure. In a first time period during which the performance of the first antenna is being tested, the DUT may be oriented in a first position such that path loss between the first antenna and the test antenna is minimized. In a second time period during which the performance of the second antenna is being tested, the DUT may be oriented in a second position such that path loss between the second antenna and the test antenna is minimized. The DUT is marked as a passing DUT if gathered test data is satisfactory.

18 Claims, 7 Drawing Sheets

METHODS FOR REDUCING PATH LOSS WHILE TESTING WIRELESS ELECTRONIC DEVICES WITH MULTIPLE ANTENNAS

BACKGROUND

This relates generally to testing electronic devices and more particularly, to testing electronic devices that include multiple antennas.

Electronic devices often incorporate wireless communications circuitry. For example, devices may communicate using the Wi-Fi® (IEEE 802.11) bands at 2.4 GHz and 5.0 GHz. Wireless communications are also possible in cellular telephone telecommunications bands and other radio-frequency bands. In schemes such as antenna diversity schemes, an electronic device may use an array of multiple antennas to handle wireless communications.

When manufacturing such types of multi-antenna wireless devices in large volumes, the performance of the wireless communications circuitry on each device can be evaluated using a radio-frequency test station to ensure that each device satisfies design criteria. A radio-frequency test station typically includes a test host, a tester (i.e., a signal generator), and an electromagnetic shielding test enclosure having a test antenna. The signal generator is connected to the test host. Arranged in this way, the test host configures the signal generator to transmit radio-frequency signals via the test antenna of the electromagnetic shielding test enclosure to a corresponding electronic device under test (DUT) during production testing.

In conventional radio-frequency test arrangements, a wireless DUT having only one antenna is placed into the electromagnetic shielding test enclosure. The test host directs the signal generator to broadcast downlink test signals to the DUT (i.e., the signal generator radiates test signals to the DUT using the test antenna in the shielding test enclosure). The DUT may receive the downlink test signals using its antenna.

The DUT may be configured to analyze the received downlink test signals and to determine whether its wireless communications circuitry satisfies performance criteria. For example, the DUT can compute a receive power level based on the received downlink signals. If the receive power level is less than a predetermined threshold, the DUT is marked as a passing DUT. If the receive power level is greater than the predetermined threshold, the DUT is marked as a failing DUT.

Testing a multi-antenna device in this way may not be suitable for testing DUTs containing at least first and second antennas and may yield inaccurate results because the conventional test method holds the DUT in a fixed position within the electromagnetic shielding test enclosure. If in the fixed position the placement of the first antenna is closer to the test antenna, measurement results may be skewed towards the first antenna (i.e., test results may be more accurate for the first antenna and less accurate for the second antenna). If in the fixed position the place of the second antenna is closer to the test antenna, measurement results may be skewed towards the second antenna (i.e., test results may be more accurate for the second antenna and less accurate for the first antenna). There are also cases where the at least two antennas are both the same distance from the test antenna but the device's orientation favors one antenna compared to another due to polarization.

It may therefore be desirable to provide improved ways for testing electronic devices having multiple antennas in a production environment.

SUMMARY

Test stations in a radio-frequency test system can be used to perform radio-frequency testing on wireless devices under test (DUTs) each having at least first and second antenna structures. Each test station may include a test host, a test unit (e.g., a spectrum analyzer, a vector network analyzer, a signal generator, etc.), and a test enclosure (e.g., a transverse electromagnetic cell). A test antenna such as an inductive coupler may be placed within the test enclosure for radiating and receiving radio-frequency test signals to and from a DUT using near field communications mechanisms.

Prior to testing, a reference DUT may be calibrated to determine optimal DUT orientations within the test enclosure. For example, a first DUT orientation may be determined during calibration operations that minimize radio-frequency signal path loss between the first antenna structure and the test antenna (e.g., a first DUT orientation that aligns the dominant electric field polarization and magnetic field associated with the first antenna structure to the dominant electric field polarization associated with the test antenna). A second DUT orientation may be determined during calibration operations that minimize path loss between the second antenna structure and the test antenna (e.g., a second DUT orientation that aligns the dominant electric field polarization associated with the second antenna structure to the dominant electric field polarization associated with the test antenna).

Once the first and second orientations have been determined, a production DUT may be placed in a corresponding test fixture and inserted into the test enclosure (e.g., a shield enclosure such as a transverse electromagnetic cell, a test chamber, etc.). The test fixture may be supported by a positioner such as a DUT rotator. The DUT rotator may serve to rotate/tilt/pivot the DUT about any desired axis or may be used to shift the DUT vertically/horizontally to place the DUT in different orientations within the test enclosure.

For example, the DUT rotator may position the DUT in the first DUT orientation that minimizes the path loss between the first antenna structure and the test antenna when testing the performance of the first antenna structure. The second antenna structure may be switched out of use when the first antenna structure is being tested. The DUT rotator may then position the DUT in the second DUT orientation that minimizes the path loss between the second antenna structure and the test antenna when testing the performance of the second antenna structure. The first antenna structure may be switched out of use when the second antenna structure is being tested. The position of the DUT may be fixed when the test unit is actively radiating radio-frequency test signals to the DUT and performing measurements on corresponding signals received from the DUT.

The DUT may be marked as a passing or failing DUT depending on test results gathered using the test unit. For example, the DUT may be marked as a passing DUT if test data for both the first and second antenna structures is satisfactory. If test data for at least one of the first and second antenna structures fails to satisfy design criteria, the DUT may be marked as a failing DUT. A failing DUT may be sent for rework or may be scrapped.

Further features of the present invention, its nature and various advantages will be more apparent from the accompanying drawings and the following detailed description.

DETAILED DESCRIPTION

Electronic devices may be provided with wireless communications circuitry. The wireless communications circuitry may be used to support wireless communications in multiple wireless communications bands. The wireless communications circuitry may include multiple antennas arranged to implement an antenna diversity system.

The antennas can include loop antennas, inverted-F antennas, strip antennas, planar inverted-F antennas, slot antennas, hybrid antennas that include antenna structures of more than one type, or other suitable antennas. Conductive structures for the antennas may be formed from conductive electronic device structures such as conductive housing structures, traces on substrates such as traces on plastic, glass, or ceramic substrates, traces on flexible printed circuit boards ("flex circuits"), traces on rigid printed circuit boards (e.g., fiberglass-filled epoxy boards), sections of patterned metal foil, wires, strips of conductor, other conductive structures, or conductive structures that are formed from a combination of these structures.

Figure 1:
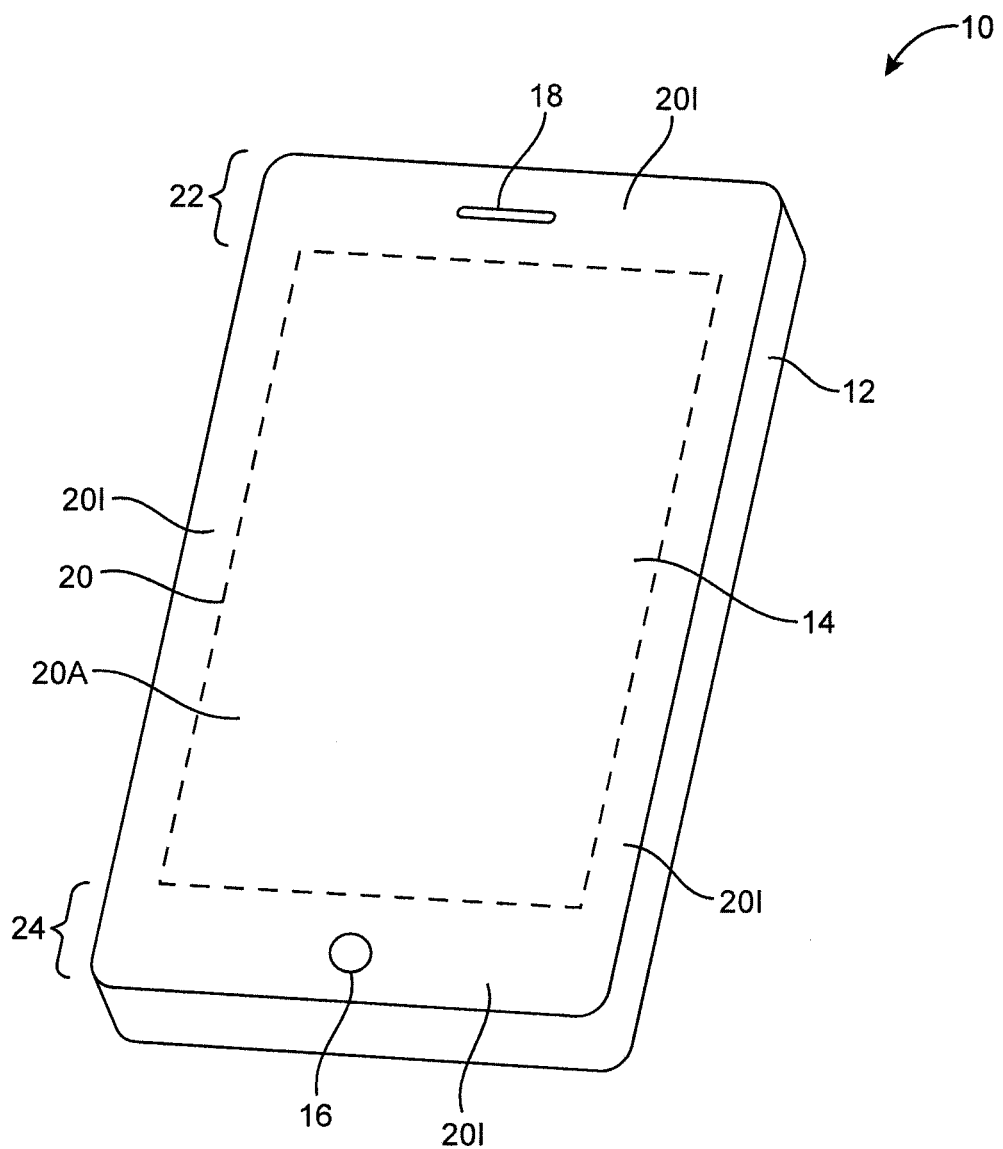
FIG. 1 is a perspective view of an illustrative electronic device of the type that includes multiple antennas that may be tested in accordance with an embodiment of the present invention.

An illustrative electronic device of the type that may be provided with one or more antennas is shown in FIG. 1. Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, a media player, etc.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. Display 14 may, for example, be a touch screen that incorporates capacitive touch electrodes. Display 14 may include image pixels formed form light-emitting diodes (LEDs), organic LEDs (OLEDs), plasma cells, electronic ink elements, liquid crystal display (LCD) components, or other suitable image pixel structures. A cover glass layer may cover the surface of display 14. Portions of display 14 such as peripheral regions 201 may be inactive and may be devoid of image pixel structures. Portions of display 14 such as rectangular central portion 20A (bounded by dashed line 20) may correspond to the active part of display 14. In active display region 20A, an array of image pixels may be used to display images for a user.

The cover glass layer that covers display 14 may have openings such as a circular opening for button 16 and a speaker port opening such as speaker port opening 18 (e.g., for an ear speaker for a user). Device 10 may also have other openings (e.g., openings in display 14 and/or housing 12 for accommodating volume buttons, ringer buttons, sleep buttons, and other buttons, openings for an audio jack, data port connectors, removable media slots, etc.).

Housing 12 may include a peripheral conductive member such as a bezel or band of metal that runs around the rectangular outline of display 14 and device 10 (as an example).

Antennas may be located along the edges of device 10, on the rear or front of device 10, as extending elements or attachable structures, or elsewhere in device 10. With one suitable arrangement, which is sometimes described herein as an example, device 10 may be provided with one or more antennas at lower end 24 of housing 12 and one or more antennas at upper end 22 of housing 12. Locating antennas at opposing ends of device 10 (i.e., at the narrower end regions of display 14 and device 10 when device 10 has an elongated rectangular shape of the type shown in FIG. 1) may allow these antennas to be formed at an appropriate distance from ground structures that are associated with the conductive portions of display 14 (e.g., the pixel array and driver circuits in active region 20A of display 14).

If desired, a first cellular telephone antenna may be located in region 24 and a second cellular telephone antenna may be located in region 22. Antenna structures for handling satellite navigation signals such as Global Positioning System signals or wireless local area network signals such as IEEE 802.11 (WiFi®) signals or Bluetooth® signals may also be provided in regions 22 and/or 24 (either as separate additional antennas or as parts of the first and second cellular telephone antennas).

In regions 22 and 20, openings may be formed between conductive housing structures and printed circuit boards and other conductive electrical components that make up device 10. These openings may be filled with air, plastic, or other dielectrics. Conductive housing structures and other conductive structures may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element such as an inverted-F antenna resonating element formed from part of a conductive peripheral housing structure in device 10 from the ground plane, or may otherwise serve as part of antenna structures formed in regions 20 and 22.

Antennas may be formed in regions 22 and 24 that are identical (i.e., antennas may be formed in regions 22 and 24 that each cover the same set of cellular telephone bands or other communications bands of interest). Due to layout constraints or other design constraints, it may not be desirable to use identical antennas. Rather, it may be desirable to implement the antennas in regions 22 and 24 using different designs. For example, the first antenna in region 24 may cover all cellular telephone bands of interest (e.g., four or five bands) and the second antenna in region 22 may cover a subset of the four or five bands handled by the first antenna.

Arrangements in which the antenna in region 24 handles a subset of the bands handled by the antenna in region 22 (or vice versa) may also be used.

In configurations in which the antennas in regions 22 and 24 are not identical, use of one antenna may be favored over the other. For example, it may be preferable to use the antenna in region 24 rather than the antenna in region 22 due to considerations such as superior efficiency, superior band coverage, superior radiation patterns, etc. In configurations such as these in which it is preferably to use the first antenna (e.g., the cellular antenna in region 24) over the second antenna (e.g., the cellular antenna in region 22), the first antenna may be referred to as the primary antenna for device 10 and the second antenna may be referred to as the secondary antenna for device 10. Device 10 may attempt to use the primary antenna as much as possible (due to factors such as superior efficiency, band coverage, or radiation pattern), but may switch to using the secondary antenna when operation of the primary antenna is disrupted. Antenna operation can be disrupted when an antenna in device 10 is blocked by an external object such as a user's hand, when device 10 is placed near objects that interfere with proper antenna operation, or due to other factors (e.g., device orientation relative to its surroundings, etc.). If desired, both the primary and secondary antennas may be used simultaneously (e.g., when receiving signals). This type of arrangement may be used, for example, to improve reception quality by combining signals that have been received using the primary antenna with signals that have been received using the secondary antenna.

Antenna diversity systems in which device 10 has a primary antenna and a secondary antenna are sometimes described herein as an example. This is, however, merely illustrative. Device 10 may use an antenna diversity arrangement that is based on three or more antennas, may use antennas that are substantially identical (e.g., in band coverage, in efficiency, etc.), or may use other types of antenna configurations.

Figure 2:
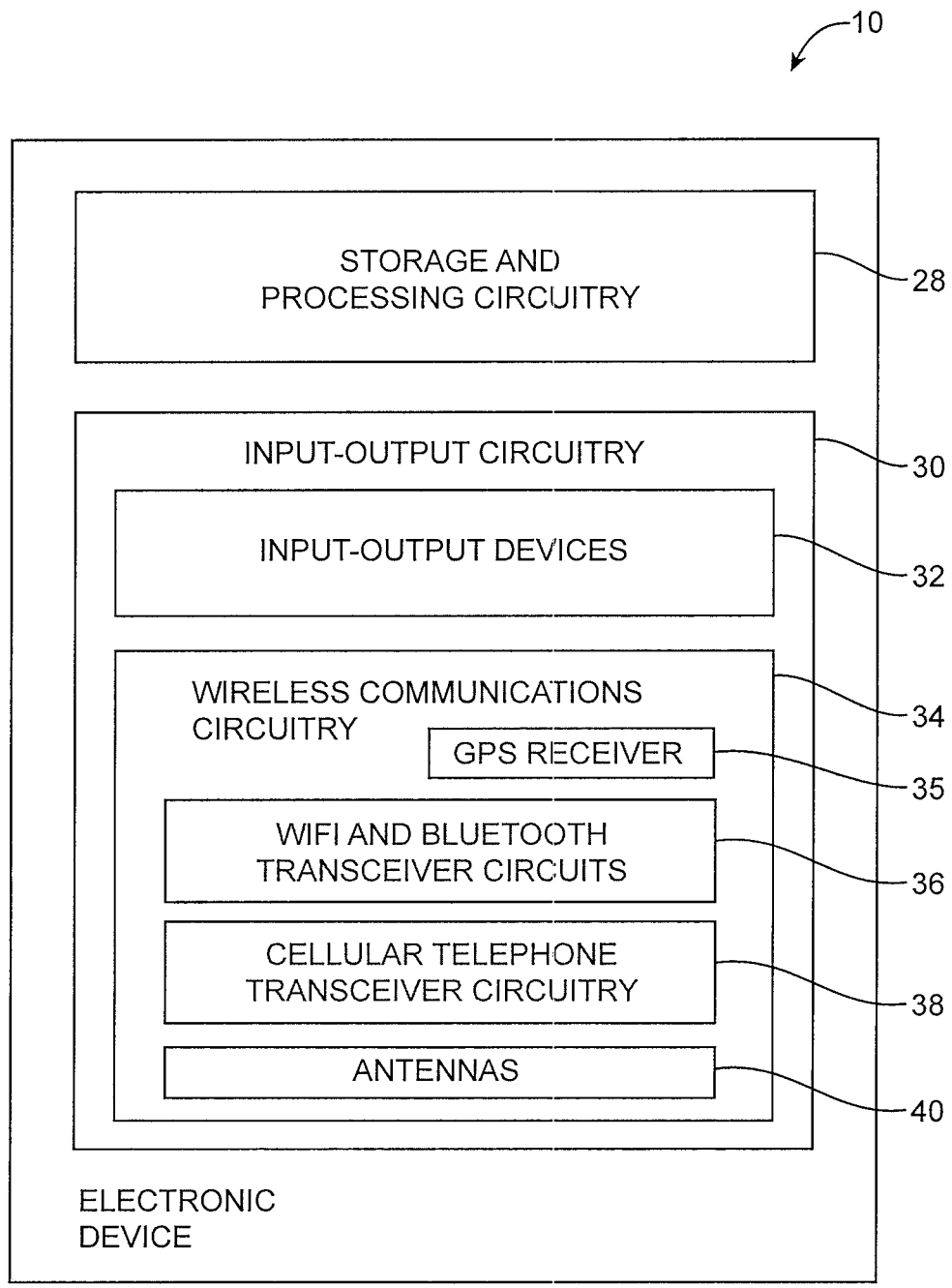
FIG. 2 is a top view of an illustrative electronic device of the type shown in FIG. 1 in accordance with an embodiment of the present invention.

A schematic diagram of electronic device 10 is shown in FIG. 2. As shown in FIG. 2, electronic device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 and other control circuits such as control circuits in wireless communications circuitry 34 may be used to control the operation of device 10. This processing circuitry may be based on one or more microprocessors, microcontrollers, digital signal processors, baseband processors, power management units, audio codec chips, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Circuitry 28 may be configured to implement control algorithms that control the use of antennas in device 10. For example, to support antenna diversity schemes and MIMO schemes or other multi-antenna schemes, circuitry 28 may perform transmitted and received signal monitoring operations, sensor monitoring operations, and other data gathering operations and may, in response to the gathered data, control which antenna structures within device 10 are being used to receive and process data. As an example, circuitry 28 may control which of two or more antennas is being used to receive incoming radio-frequency signals, may control which of two or more antennas is being used to transmit radio-frequency signals, may control the process of routing data streams over two or more antennas in device 10 in parallel, etc. Circuitry 28 may also activate and deactivate transceiver circuitry to provide desired levels of signal monitoring while conserving power. In performing these control operations, circuitry 28 may open and close switches, may turn on and off receivers and transmitters, may adjust impedance matching circuits, may configure switches in front-end-module (FEM) radio-frequency circuits that are interposed between radio-frequency transceiver circuitry and antenna structures (e.g., filtering and switching circuits used for impedance matching and signal routing), and may otherwise control and adjust the components of device 10. Control algorithm data such as settings for predetermined threshold values and other control settings may be stored in storage in circuitry 28.

Input-output circuitry 30 may be used to allow data to be supplied to device 10 and to allow data to be provided from device 10 to external devices. Input-output circuitry 30 may include input-output devices 32. Input-output devices 32 may include touch screens, buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 32 and may receive status information and other output from device 10 using the output resources of input-output devices 32.

Wireless communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals.

Wireless communications circuitry 34 may include satellite navigation system receiver circuitry such as Global Positioning System (GPS) receiver circuitry 35 (e.g., for receiving satellite positioning signals at 1575 MHz). Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as bands at 850 MHz, 900 MHz, 1800 MHz, 1900 MHz, and 2100 MHz or other cellular telephone bands of interest. Wireless communications circuitry 34 can include circuitry for other short-range and long-range wireless links if desired. For example, wireless communications circuitry 34 may include, wireless circuitry for receiving radio and television signals, paging circuits, etc. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable antenna types. For example, antennas 40 may include antennas with resonating elements that are formed from loop antenna structure, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna and another type of antenna may be used in forming a remote wireless link antenna. As described in connection with FIG. 1, there may be multiple cellular telephone antennas in device 10. For example, there may be a primary cellular telephone antenna in region 24 of device 10 and a secondary cellular telephone antenna in region 22 of device 10. These antennas may be fixed or may be tunable.

Figure 3:
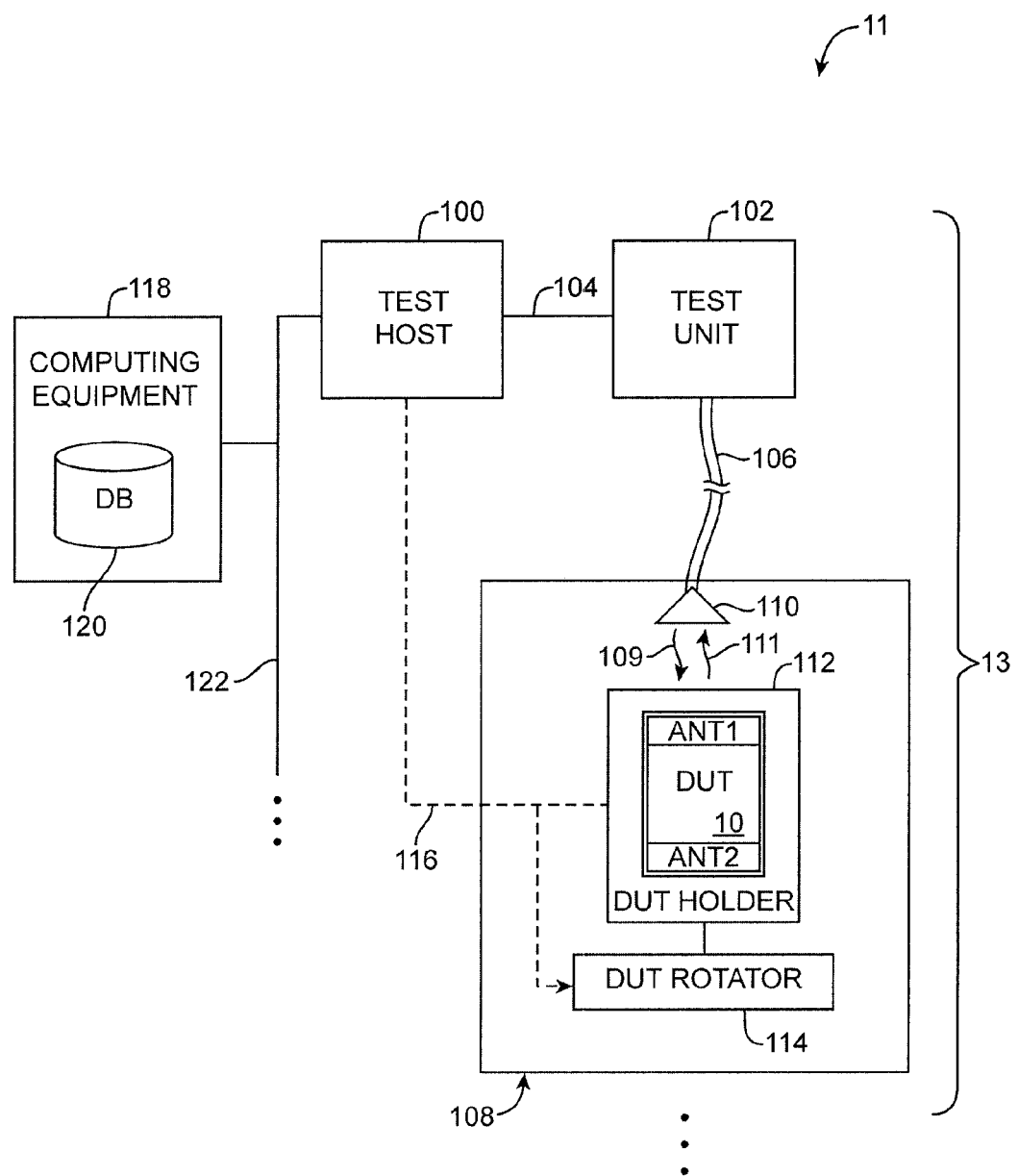
FIG. 3 is a diagram of an illustrative test station that includes a device under test rotator in accordance with an embodiment of the present invention.

During testing, many wireless devices (e.g., tens, hundreds, thousands, or more of devices 10) may be tested in a test system such as test system 11 of FIG. 3. Electronic devices that are being tested in test system 11 may sometimes be referred to as devices under test (DUTs). Test system 11 may include test accessories, computers, network equipment, tester control boxes, cabling, test enclosures, and other test equipment for generating and receiving radio-frequency test signals and gathering test results. Test system 11 may include multiple test stations such as test stations 13. There may, for example, be eighty test stations 13 at a given test site. Test system 11 may include any desired number of test stations to achieve desired test throughput.

Each test station 13 may include a test host such as test host 100, a tester such as test unit 102, and a test enclosure such as test enclosure 108. Test host 100 may, for example, be a personal computer or other types of computing equipment. Test unit 102 may be a signal generator, a spectrum analyzer, a vector network analyzer, and other testers suitable for generating radio-frequency test signals and for performing radio-frequency measurements on signals received from DUT 10. In other suitable arrangements, test unit 102 may be a radio communications tester of the type that is sometimes referred to as a call box or a base station emulator. Test unit 102 may, for example, be the CMU300 Universal Radio Communication Tester available from Rohde & Schwarz. Test unit 102 may be used to emulate the behavior of a network access point to test the ability of transceiver 36 to support the WiFi® communications protocol, the Bluetooth® communications protocol, or other communications standards. If desired, test unit 102 may be configured to emulate the behavior of a base transceiver station during a telephone call with cellular telephone transceiver circuitry 38.

Test unit 102 may be operated directly or via computer control (e.g., when test unit 102 receives commands from test host 100). When operated directly, a user may control test unit 102 by supplying commands directly to the signal generator using the user input interface of test unit 102. For example, a user may press buttons in a control panel on the signal generator while viewing information that is displayed on a display in test unit 102. In computer controlled configurations, test host 100 (e.g., software running autonomously or semi-autonomously on the computer) may communicate with test unit 102 by sending and receiving data over a wired path 104 or a wireless path between the computer and the signal generator (as an example).

During wireless testing, at least one DUT 10 may be placed within test enclosure 108. DUT 10 may each be coupled to test host 100 via control line 116. The connection represented by line 116 may be a Universal Serial Bus (USB) based connection, a Universal Asynchronous Receiver/Transmitter (UART) based connection, or other suitable types of connection. During testing, test host 100 may send control signals to DUT 10 and may retrieve test data from DUT 10 via connection 116. DUT 10 need not be electrically connected to test host 100.

Test enclosure 108 may be a shielded enclosure that can be used to provide radio-frequency isolation when performing electromagnetic compatibility (EMC) radiated tests without experiencing interference from outside environment. The interior of test enclosure 108 may be lined with radio-frequency absorption material such as rubberized foam configured to minimize reflections of wireless signals. Test enclosure 108 may include in its interior wireless structures 110 for communicating over short distances using near field electromagnetic coupling (e.g., over ten centimeters or less). Wireless structures 110 in test enclosure 108 may include an inductor or other near field communications element (sometimes referred to as a near field communications test antenna or near field communications coupler) used to radiate (transmit) corresponding near field electromagnetic signals to DUT 10. Test antenna 110 may be coupled to test unit 106 via a radio-frequency cable 106 (e.g., a coaxial cable). Test antenna 110 may be used during production test procedures to perform over-the-air testing on DUT 10 (e.g., so that radio-frequency test signals may be conveyed between test unit 102 and DUT 10 via coupler 110). Test antenna 110 may, as an example, be a microstrip antenna such as a microstrip patch antenna.

During testing, downlink test signals may be conveyed from test antenna 110 to DUT 10 in the direction of arrow 109, whereas uplink test signals may be conveyed from DUT 10 to test antenna 110 in the direction of arrow 111. Test radio-frequency signals may be conveyed between test unit 102 and DUT 10 over a non-protocol-compliant communications path (e.g., an unauthenticated wireless communications data link) or a protocol-compliant communications link (e.g., an authenticated wireless communications link).

DUT 10 may be loaded with a test operating system (e.g., a simplified operating system that lacks a full Internet Protocol (IP) stack implementation) or a normal user operating system (e.g., an operating system that includes a full Internet Protocol (IP) stack implementation). DUT 10 may include wireless performance measurement circuitry capable of analyzing the received test signals.

DUT 10 may be mounted in a test fixture such as test fixture (sometimes referred to as a DUT holder) 112 during testing. Test fixture 112 may contain a cavity that receives DUT 10. Test fixture 112 may, if desired, be formed from dielectric materials such as plastic to avoid interference with radio-frequency test measurements. The relative position/orientation of DUT 10 with respect to test antenna 110 may be controlled manually by an operator of test system 11 or may be adjusted using computer-controlled or manually controlled a positioning device such as positioner 114. Positioner 114 may include actuators for controlling lateral and/or rotational movement of DUT 10 and may therefore sometimes be referred to herein as a DUT rotator. DUT rotator 114 may be controlled using control signals generated by test host 100 routed over path 116.

During production testing, the performance of the primary antenna (e.g., antenna ANT1 in region 24 of DUT 10) and the secondary antenna (e.g., antenna ANT2 in region 22 of DUT 10) may be tested. It may be desirable to properly position DUT 10 with respect to test antenna 110 so that radio-frequency signal path loss between the primary antenna and test unit 102 is minimized (when testing the primary antenna) and so that path loss between the secondary antenna and test unit 102 is minimized (when testing the secondary antenna).

Radio-frequency signal path loss can be defined as the attenuation in power as electrical signals travel through a particular medium. Sources contributing to path loss between DUT 10 and test unit 102 may include OTA path loss (e.g., path loss associated with the propagation of radio-frequency signals as they propagate through air), path loss associated with test antenna 110 during actual wireless transmission, radio-frequency cable path loss (e.g., path loss associated with cable 106), etc.

Path loss for each antenna in DUT 10 that is placed within test enclosure 108 may be sensitive to the orientation of DUT 10 relative to test antenna 110. For example, consider a scenario in which DUT 10 is positioned so that ANT1 is closer to test antenna 110 than ANT2. In this scenario, the path loss between ANT1 and test antenna 110 may be less than the path loss between ANT2 and test antenna 110. Excessive amounts of path loss can also negatively impact test results.

In order to be able to compare test data gathered for each of the multiple antennas within DUT 10, it may be desirable to position DUT 10 using DUT rotator 114 in different arrangements when testing the performance of each of the multiple antennas. For example, DUT rotator 114 may be configured to orient DUT 10 in a first position that minimizes the path loss between ANT1 and test antenna 110 in a first time period during which ANT1 is being tested (e.g., DUT 10 may be oriented such that the dominant electric field polarization associated with ANT1 is aligned with the dominant electric field polarization of test coupler 110). In a second time period during which ANT2 is being tested, DUT rotator 114 may be configured to orient DUT 10 in a second position that minimizes the path loss between ANT2 and test antenna 110 (e.g., DUT 10 may be oriented such that the dominant electric field polarization associated with ANT2 is aligned with the dominant electric field polarization of test coupler 110).

As shown in FIG. 3, each test station 13 may be connected to computing equipment 118 through line 122. Computing equipment 118 may include storage equipment on which a database 120 is stored. After desired radio-frequency measurements have been gathered from each of the multiple antennas in DUT 10, DUT 10 may be removed from test enclosure 108. Test data may then be loaded onto associated test host 100. The test data gathered at the different test stations 13 may be stored centrally in database 40.

Figure 4A:
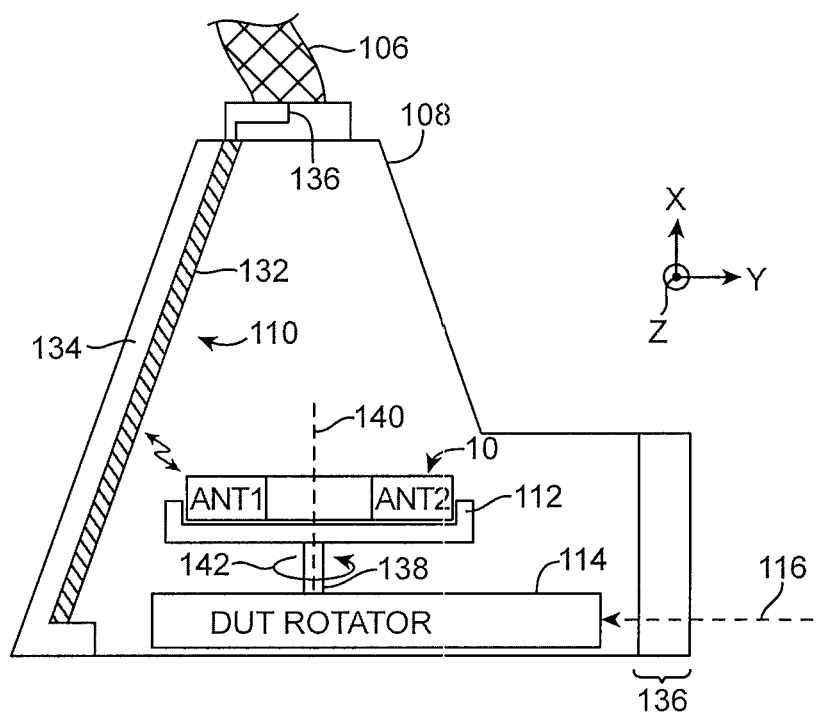
FIGS. 4A and 4B are side views showing how a device under test may be rotated about an axis that is perpendicular to the base of a test cell in which the device under test is being tested in accordance with an embodiment of the present invention.
Figure 4B:
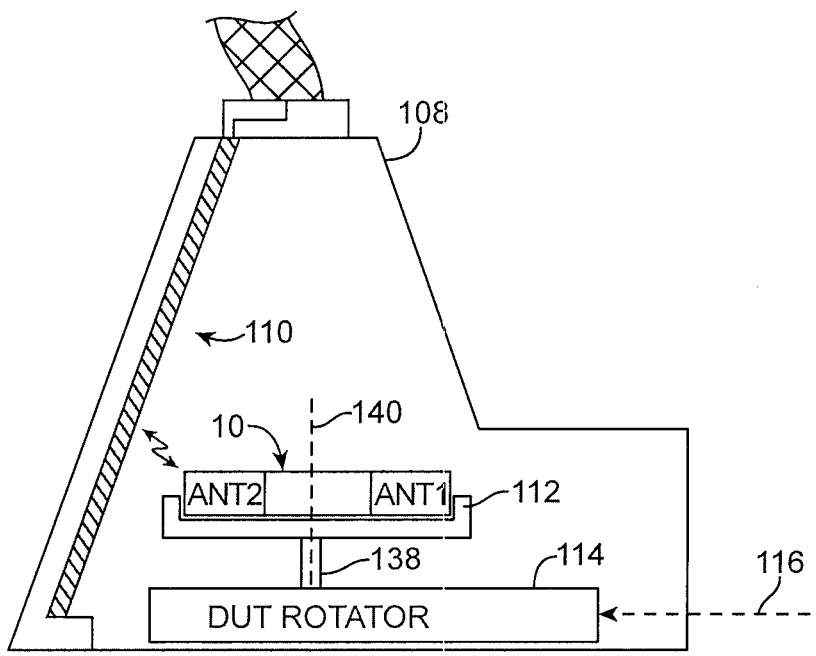

In one suitable arrangement of the present invention, test enclosure 108 may be a pyramidal-shaped transverse electromagnetic (TEM) cell (see, e.g., FIGS. 4A and 4B). The shape of test enclosure 108 shown herein is merely illustrative and is not intended to limit the scope of the present invention. If desired, test enclosure 108 may have a cubic structure (six planar walls), a rectangular prism-like structure (six rectangular walls), or other suitable structures.

As shown in FIG. 4A, test antenna 110 may be formed along at least one interior surface of TEM cell 108. Test antenna 110 may, as an example, include an inductive element 132 formed in dielectric material 134. The inductive element may be coupled to a signal conductor in cable 106 via conductive path 136.

Test fixture 112 may be inserted into test enclosure 108 through door 136. To test a given DUT, test fixture 112 may be removed from the interior of test enclosure 108 and a test operator may place the given DUT into a corresponding cavity in test fixture 112 (while door 136 is open). The test fixture and DUT assembly may then be inserted within test enclosure 108 and door 136 may be shut. Door 136 should not be opened during test operations.

When testing ANT1, DUT rotator 114 may position DUT 10 such that the path loss between ANT1 and test antenna 110 is reduced (see, e.g., the DUT orientation as shown in FIG. 4A). Secondary antenna ANT2 may be disabled while ANT1 is being tested. When sufficient test data has been gathered for ANT1, DUT rotator 114 may be configured to rotate test fixture 112 by rotating supporting structure 138 (e.g., a support member connecting test fixture 112 to DUT rotator 114) about axis 140 in the direction of arrow 142. Axis 140 may be parallel to a reference X axis that is perpendicular to a planar base surface of test enclosure 108 (e.g., a base on which test enclosure 108 is supported on a table).

DUT rotator 114 may, for example, rotate DUT 10 to a new position such that the path loss between ANT2 and test antenna 110 is reduced when testing ANT2 (see, e.g., the DUT orientation as shown in FIG. 4B). The position of DUT 10 may be fixed during a first period when ANT1 is being tested. The position of DUT 10 may be fixed during a second period when ANT2 is being tested. The position of DUT 10 may be changed during a transition period between testing of ANT1 and testing of ANT2 (e.g., DUT 10 may only be rotated during the transition period).

Figure 5:
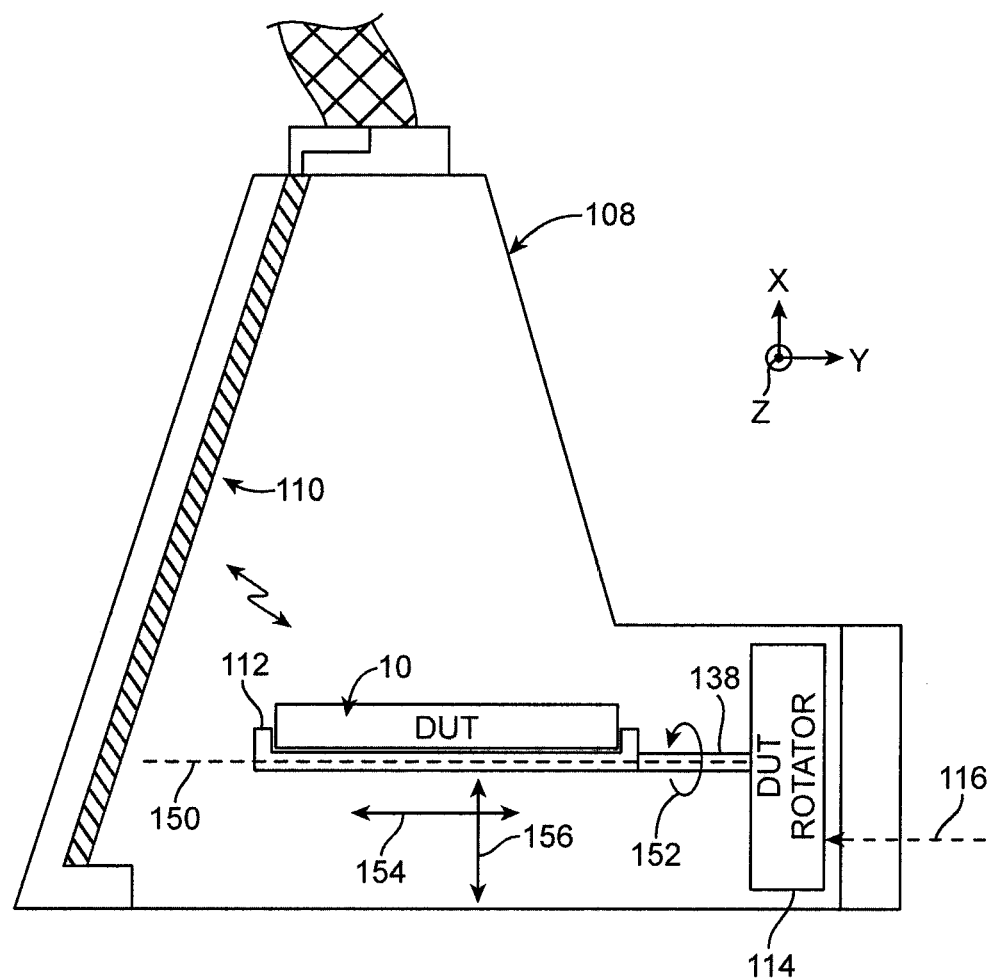
FIGS. 5 and 6 are side views showing how a device under test may be rotated about an axis that is parallel to the base of a test cell in which the device under test is being tested in accordance with an embodiment of the present invention.

In another suitable embodiment of the present invention, DUT rotator 114 may be configured to rotate DUT 10 about axis 150 in the direction of arrow 152 (see, e.g., FIG. 5). Axis 150 may be parallel to a reference Y axis that is parallel to the base of test enclosure 108. DUT 10 may be rotated about axis 150 during the transition period between testing of ANT1 and testing of ANT2 or may be rotated during the first and second periods while test signals are being conveyed between DUT 10 and test unit 102, if desired. If desired, DUT rotator 114 may also be used to shift DUT 10 vertically up/down in the direction of arrow 156 (along the X axis) or may be used to shift DUT 10 horizontally in/out in the direction of arrow 154 (along the Y axis) to place DUT 10 in respective positions so that path loss between test coupler 110 and the corresponding first and second antennas in DUT 10 is minimized.

Figure 6:
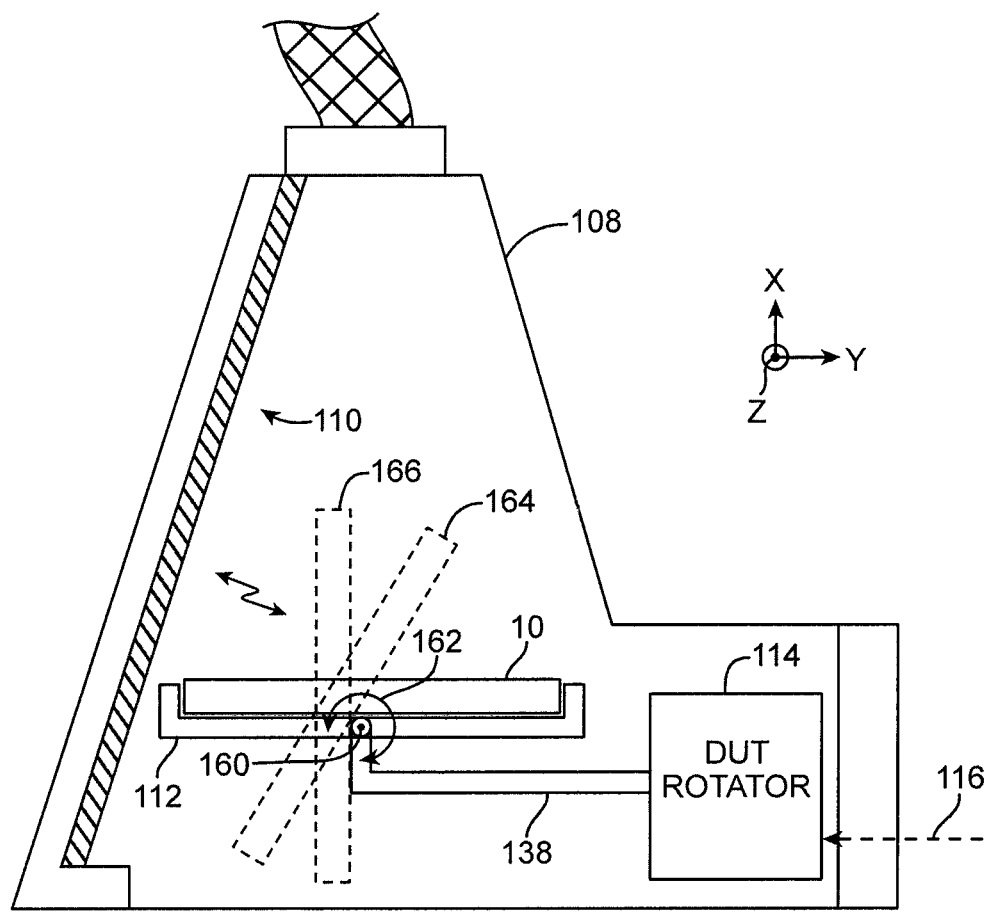

In another suitable embodiment of the present invention, DUT rotator 114 may also be configured to rotate DUT 10 about axis 160 in the direction of arrow 162 (see, e.g., FIG. 6). Axis 150 may be parallel to a reference Z axis that is parallel to the base of test enclosure 108 and perpendicular to the X and Y axes. As shown in FIG. 6, DUT 10 may be rotated to a new position 164 such that ANT1 and ANT2 are both equidistant to test antenna 110 or to a new position 166 such that DUT 10 is perpendicular to the base of test enclosure 108. DUT 10 may be rotated about axis 160 during the transition period between testing of ANT1 and testing of ANT2 or may be rotated during the first and second periods while test signals are being conveyed between DUT 10 and test unit 102, if desired.

Figure 7:
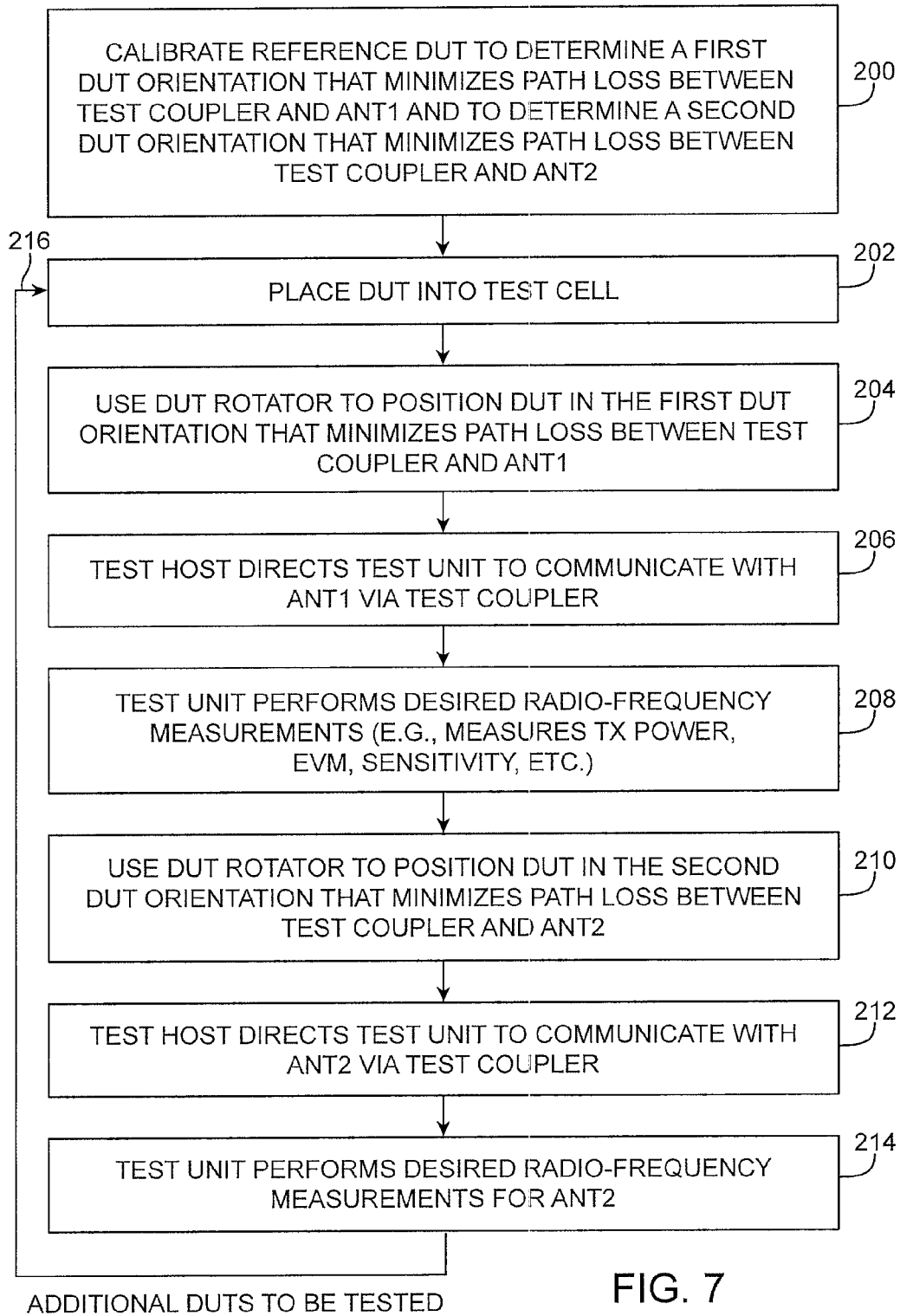
FIG. 7 is a flow chart of illustrative steps involved in testing a device under test using a test station of the type shown in connection with FIG. 3 in accordance with an embodiment of the present invention.

FIG. 7 shows illustrative steps involved in testing DUT 10 using test station 13. At step 200, a reference DUT may be calibrated to determine a first DUT orientation that minimizes the path loss between test antenna 110 and the primary antenna and to determine a second DUT orientation that minimizes the path loss between test antenna 110 and the secondary antenna.

At step 202, a production DUT 10 may be placed into TEM cell 108. At step 204, DUT rotator 114 may be configured to position DUT 10 in the first DUT orientation that minimizes path loss between test antenna 110 and the primary antenna (e.g., using any combination of the rotating schemes described in connection with FIGS. 4A, 4B, 5, and 6). At step 206, test host 100 may direct test unit 102 to communicate with DUT 10 via its primary antenna (e.g., radio-frequency test signals may be conveyed between the primary antenna of DUT 10 and test unit 102 while the DUT's secondary antenna is turned off). As an example, test unit 102 may be configured to transmit radio-frequency downlink test signals to the DUT.

In response to receiving the downlink test signals, the DUT may transmit uplink signals back to test unit 102.

At step 208, test unit 102 may perform desired radio-frequency measurements on the uplink test signals. For example, test unit 102 may be configured to measure the DUT's transmit power, downlink sensitivity, error vector magnitude (EVM), adjacent channel leakage ratio, power spectral density, etc. If desired, DUT 10 may also be configured to analyze the downlink test signals to compute downlink radio-frequency metrics such as receive signal strength indication (RSSI) information, bit error rate, packet error rate, frame error rate, etc. Test data computed by the DUT may be stored internally on storage and processing circuitry 28. The first antenna of DUT 10 may be disabled after sufficient data has been gathered for the first antenna.

At step 210, DUT rotator 114 may be used to position DUT 10 in the second DUT orientation that minimizes path loss between test antenna 110 and the secondary antenna (e.g., using any combination of the rotating schemes described in connection with FIGS. 4A, 4B, 5, and 6). At step 212, test host 100 may direct test unit 102 to communicate with DUT 10 via its secondary antenna (e.g., radio-frequency test signals may be conveyed between the secondary antenna and test unit 102 while the primary antenna is turned off).

At step 214, test unit 102 may be used to perform desired radio-frequency measurements on the uplink test signals transmitted by the secondary antenna. DUT 10 may also be configured to analyze the downlink test signals received using the secondary antenna to compute receive radio-frequency performance metrics. Test data computed by DUT 10 during this time may also be stored internally on storage and processing circuitry 28. Processing may loop back to step 216 if to test an additional device under test, as indicated by path 216.

The embodiments described in connection with FIGS. 3-7 are merely illustrative and do not serve to limit the scope of the present invention. If desired, the steps of FIG. 7 and the different ways of orienting DUT 10 as shown in FIGS. 4A, 4B, 5, and 6 may be extended to testing wireless devices with any suitable number of antennas.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for using a test station to test a production device under test that includes at least first and second antenna structures, wherein the first and second antenna structures are formed on opposing sides of the production device under test, and wherein the test station includes a test enclosure, the method comprising:
    coupling the production device under test to a test fixture in the test enclosure;
    positioning the production device under test in a first orientation;
    after positioning the production device under test in the first orientation and while the production device under test is coupled to the test fixture, gathering test measurements on only the first antenna structure to determine whether the first antenna structure satisfies predetermined performance criteria associated with the first antenna structure, wherein test measurements are only gathered on the first antenna structure while the production device under test is in the first orientation;
    after gathering test measurements on only the first antenna, positioning the production device under test in a second orientation that is different than the first orientation; and
    following positioning the production device under test in a second orientation and the gathering of test measurements on only the first antenna structure and while the production device under test is still coupled to the test fixture, gathering test measurements on only the second antenna structure to determine whether the second antenna structure satisfies predetermined performance criteria associated with the second antenna structure, wherein test measurements are only gathered on the second antenna structure while the production device under test is in the second orientation.

2. The method defined in claim 1 wherein positioning the production device under test from the first orientation to the second orientation comprises rotating the production device under test about a rotational axis.

3. The method defined in claim 1 wherein positioning the production device under test from the first orientation to the second orientation comprises rotating the production device under test about a rotational axis that is perpendicular to a planar base surface of the test enclosure.

4. The method defined in claim 1 wherein positioning the production device under test from the first orientation to the second orientation comprises vertically shifting the production device under test about along an axis that is perpendicular to a planar base surface of the test enclosure.

5. The method defined in claim 1 wherein positioning the production device under test from the first orientation to the second orientation comprises horizontally shifting the production device under test about along an axis that is parallel to a planar base surface of the test enclosure.

6. The method defined in claim 1 wherein the test enclosure includes a test antenna and wherein positioning the production device under test in the first orientation comprises positioning the production device under test such that over-the-air radio-frequency signal path loss between the test antenna and the first antenna structure is minimized.

7. The method defined in claim 6 wherein positioning the production device under test in the second orientation comprises positioning the production device under test such that over-the-air radio-frequency signal path loss between the test antenna and the second antenna structure is minimized.

8. The method defined in claim 1 further comprising:
    in response to determining that at least one of the first and second antenna structures fails to satisfy the predetermined performance criteria, marking the production device under test as a failing device that needs to be reworked.

9. The method defined in claim 1 further comprising:
    in response to determining that the first and second antenna structures satisfy the predetermined performance criteria, marking the production device under test as a passing device and packaging the passing device as a brand new product.

10. A method for using a test station to test a device under test that includes at least first and second antenna structures, wherein the test station includes a test enclosure and a test antenna within the test enclosure, the method comprising:
    switching the second antenna structure out of use;
    after switching the second antenna structure out of use and while the device under test is mated with a test fixture within the test enclosure, positioning the device under test in a first orientation that minimizes over-the-air radio-frequency signal path loss for radio-frequency signals traveling between the test antenna and the first antenna structure;

performing radio-frequency measurements on the first antenna structure while the device under test is in the first orientation, wherein radio-frequency measurements are only performed on the first antenna structure while the device under test is in the first orientation;

switching the first antenna structure out of use and switching the second antenna structure into use;

after switching the first antenna structure out of use and switching the second antenna structure into use and while the device under test is mated with the test fixture, positioning the device under test in a second orientation that minimizes over-the-air radio-frequency signal path loss for radio-frequency signals travelling between the test antenna and the second antenna structure; and performing radio-frequency measurements on the second antenna structure while the device under test is in the second orientation, wherein radio-frequency measurements are only performed on the second antenna structure while the device under test is in the second orientation.

11. The method defined in claim 10 wherein the test enclosure comprises a transverse electromagnetic cell.

12. The method defined in claim 10 wherein positioning the device under test from the first orientation to the second orientation comprises rotating the device under test about a rotational axis.

13. The method defined in claim 10 wherein positioning the device under test from the first orientation to the second orientation comprises shifting the device under test along an axis.

14. The method defined in claim 10 wherein the test antenna comprises a near field communications element suitable for transmitting and receiving radio-frequency signals to and from the device under test using near field electromagnetic coupling mechanisms.

15. The method defined in claim 10 further comprising:
using the test station to calibrate a reference device under test to determine the first and second orientations for use when testing the device under test.

16. A method for using a test station to test a device under test that includes at least first and second antenna structures, wherein the test station includes a test enclosure and a near field communications element within the test enclosure, the method comprising:

positioning the device under test in a first orientation, wherein the first antenna structure is positioned closer to the near field communications element than the second antenna structure in the first orientation;

while the device under test is in the first orientation, receiving radio-frequency signals from the first antenna structure of the device under test with the near field communications element using near field electromagnetic coupling without receiving any radio-frequency signals from the second antenna structure of the device under test with the near field communications element while the device under test is in the first orientation, wherein radio-frequency signals are only received from the first antenna structure when the device under test is positioned in the first orientation;

positioning the device under test in a second orientation that is different from the first orientation, wherein the second antenna structure is positioned closer to the near field communications element than the first antenna structure in the second orientation; and while the device under test is in the second orientation, receiving radio-frequency signals from the second antenna structure of the device under test with the near field communications element using near field electromagnetic coupling without receiving any radio-frequency signals from the first antenna structure of the device under test with the near field communications element while the device under test is in the second orientation, wherein radio-frequency signals are only received from the second antenna structure when the device under test is positioned in the second orientation.

17. The method defined in claim 16 wherein the test enclosure comprises a transverse electromagnetic cell.

18. The method defined in claim 16 wherein the test station further includes a positioning device and wherein positioning the device under test from the first orientation to the second orientation comprises:

with the positioning device, rotating the device under test about at least one rotational axis.

* * * * *